(12) United States Patent
Choi et al.

(10) Patent No.: US 10,386,020 B2
(45) Date of Patent: Aug. 20, 2019

(54) LIGHT EMITTING DIODE (LED) MODULE ARRAY AND AN LED LAMP USING THE SAME

(71) Applicant: SAMSUNG ELECTRONICS CO., LTD., Suwon-si, Gyeonggi-Do (KR)

(72) Inventors: Pun Jae Choi, Yongin-si (KR); Jin Wook Chung, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/849,022

(22) Filed: Dec. 20, 2017

(65) Prior Publication Data

US 2018/0347766 A1 Dec. 6, 2018

(30) Foreign Application Priority Data

Jun. 5, 2017 (KR) .................. 10-2017-0069779

(51) Int. Cl.
| | |
|---|---|
| F21K 9/237 | (2016.01) |
| F21Y 115/10 | (2016.01) |
| H01L 33/08 | (2010.01) |
| H01L 33/50 | (2010.01) |
| H01L 33/54 | (2010.01) |
| H01L 33/62 | (2010.01) |
| F21V 3/06 | (2018.01) |
| F21K 9/235 | (2016.01) |
| F21K 9/232 | (2016.01) |
| H01L 33/64 | (2010.01) |
| H01L 33/60 | (2010.01) |

(52) U.S. Cl.
CPC .............. *F21K 9/237* (2016.08); *F21K 9/232* (2016.08); *F21K 9/235* (2016.08); *F21V 3/061* (2018.02); *H01L 33/507* (2013.01); *H01L 33/54* (2013.01); *H01L 33/642* (2013.01); *F21Y 2115/10* (2016.08); *H01L 33/08* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

*Primary Examiner* — Ashok Patel
(74) *Attorney, Agent, or Firm* — F. Chau & Associates, LLC

(57) ABSTRACT

A light emitting diode (LED) module array including: a plurality of LED groups connected to each other in series, each LED group including a single rod-shaped LED module or a plurality of LED modules connected to each other in parallel, wherein a number of LED modules included in a first LED group is different from a number of LED modules included in a second LED group.

18 Claims, 14 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,272,757 B1 * | 9/2012 | Fan .................... H01L 25/0753 257/778 |
| 8,324,646 B2 | 12/2012 | Lee et al. |
| 8,339,050 B2 * | 12/2012 | Lee .................... H05B 33/0803 315/185 R |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,506,632 B2 * | 11/2016 | Ogata ................. H01L 25/0753 |
| 9,905,544 B2 * | 2/2018 | Lee ....................... H01L 33/62 |
| 2016/0007419 A1 | 1/2016 | Lee et al. |
| 2016/0178133 A1 | 6/2016 | Kong et al. |
| 2016/0265748 A1 * | 9/2016 | Abe .................... H05B 33/0821 |
| 2016/0273715 A1 | 9/2016 | Janik et al. |
| 2016/0307879 A1 | 10/2016 | Lien et al. |
| 2016/0363267 A1 | 12/2016 | Jiang et al. |
| 2017/0048941 A1 | 2/2017 | Kondo et al. |

* cited by examiner

III-III'

IV-IV'

LIGHT EMITTING DIODE (LED) MODULE ARRAY AND AN LED LAMP USING THE SAME

CROSS-REFERENCE TO RELATED APPLICATION

This application claims priority under 35 U.S.C. 119 to Korean Patent Application No. 10-2017-0069779, filed on Jun. 5, 2017, in the Korean Intellectual Property Office, the disclosure of which is incorporated by reference herein in its entirety.

TECHNICAL FIELD

The present inventive concept relates to a light emitting diode (LED) module array and an LED lamp using the same.

DESCRIPTION OF RELATED ART

Incandescent and fluorescent lamps are widely used as indoor and outdoor light sources. Incandescent and fluorescent lamps may have a relatively short lifespan.

To increase the lifespan of a light source, lighting devices employing light emitting diodes (LEDs) have been developed. For example, LEDs have low power consumption, due to their high light conversion efficiency. Moreover, LEDs are able to be turned off and on quickly, since a warm-up time is not required.

In addition, an LED is more resistant to impacts, as compared to incandescent lamps and fluorescent lamps, and various color lighting effects are possible to realize. Moreover, LEDs can be made to be very small.

In view of the above, it can be seen that the range of applications employing LEDs is large, and thus, there is a growing demand for LED lighting equipment. Accordingly, there is a need to reduce LED manufacturing costs.

SUMMARY

According to an exemplary embodiment of the inventive concept, a light emitting diode (LED) module array, includes: a plurality of LED groups connected to each other in series, each LED group including a single rod-shaped LED module or a plurality of LED modules connected to each other in parallel, wherein a number of LED modules included in a first LED group is different from a number of LED modules included in a second LED group.

According to an exemplary embodiment of the inventive concept, an LED lamp includes: a bulb; a base disposed at a first end of the bulb; and an LED module array disposed in an internal space of the bulb, wherein the LED module array includes a plurality of LED groups connected to each other in series, each LED group including a single rod-shaped LED module or a plurality of LED modules connected to each other in parallel, and a number of LED modules included in a first LED group is different from a number of LED modules included in a second LED group.

According to an exemplary embodiment of the inventive concept, an LED lamp includes: a bulb; a base disposed at a first end of the bulb; and an LED module array disposed in an internal space of the bulb, wherein the LED module array is provided with a plurality of LED groups connected to each other in series, and a first LED module included in a first LED group is disposed at a first angle with respect to a central axis of the bulb, and a second LED module of a second LED group is disposed at a second angle with respect to the central axis, wherein the first and second angles are different from each other, the central axis is extended from the first end of the bulb to a second end of the bulb and at least one of the LED modules has a rod-shape.

BRIEF DESCRIPTION OF THE DRAWINGS

The above and other features of the present inventive concept will be more clearly understood by describing in detail exemplary embodiments thereof with reference to the accompanying drawings, in which.

DETAILED DESCRIPTION OF THE EMBODIMENTS

Figure 1:
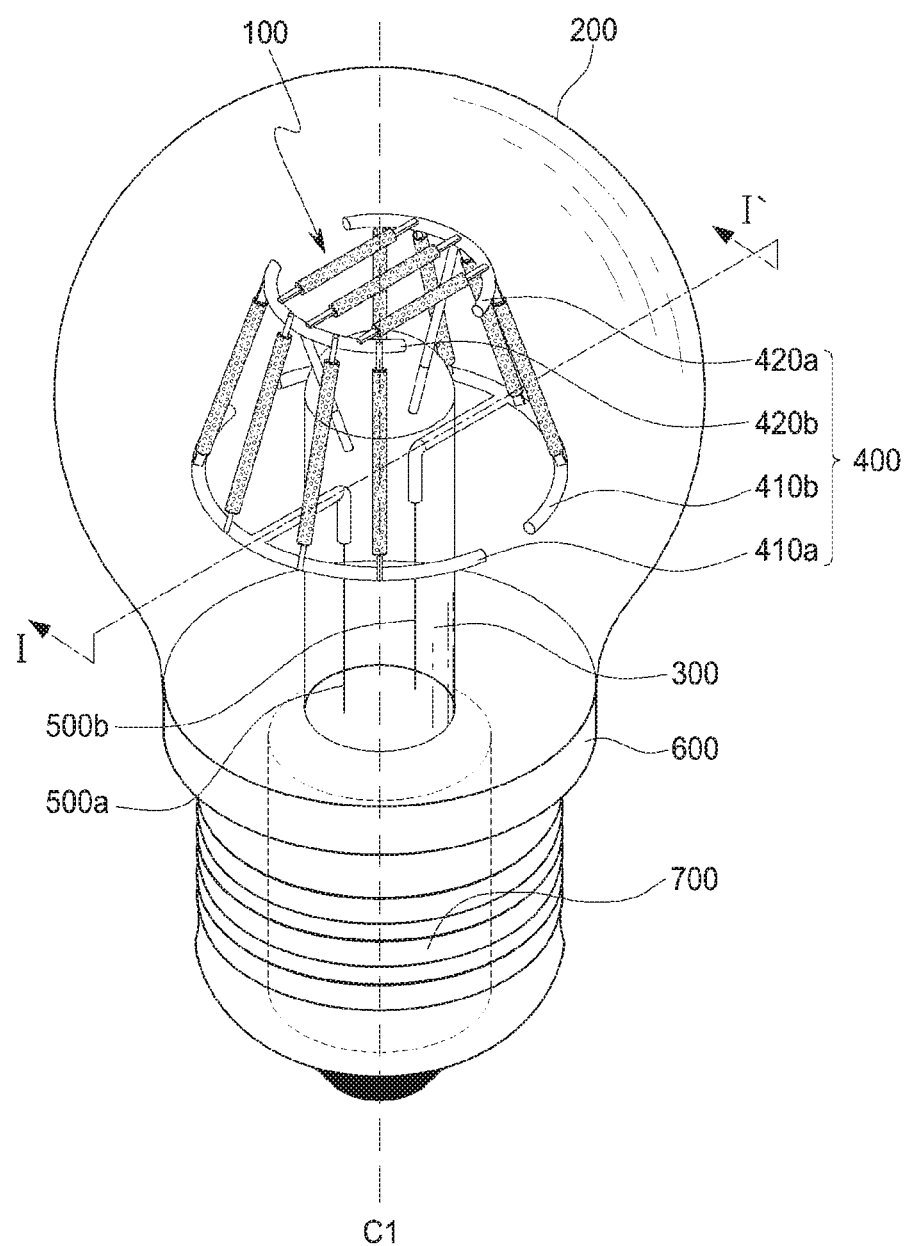
FIG. 1 is a perspective view of a light emitting diode (LED) lamp according to an exemplary embodiment of the present inventive concept.

Hereinafter, exemplary embodiments of the present inventive concept will be described in detail with reference to the accompanying drawings. In the drawings, like reference numerals may refer to like elements.

Figure 2:
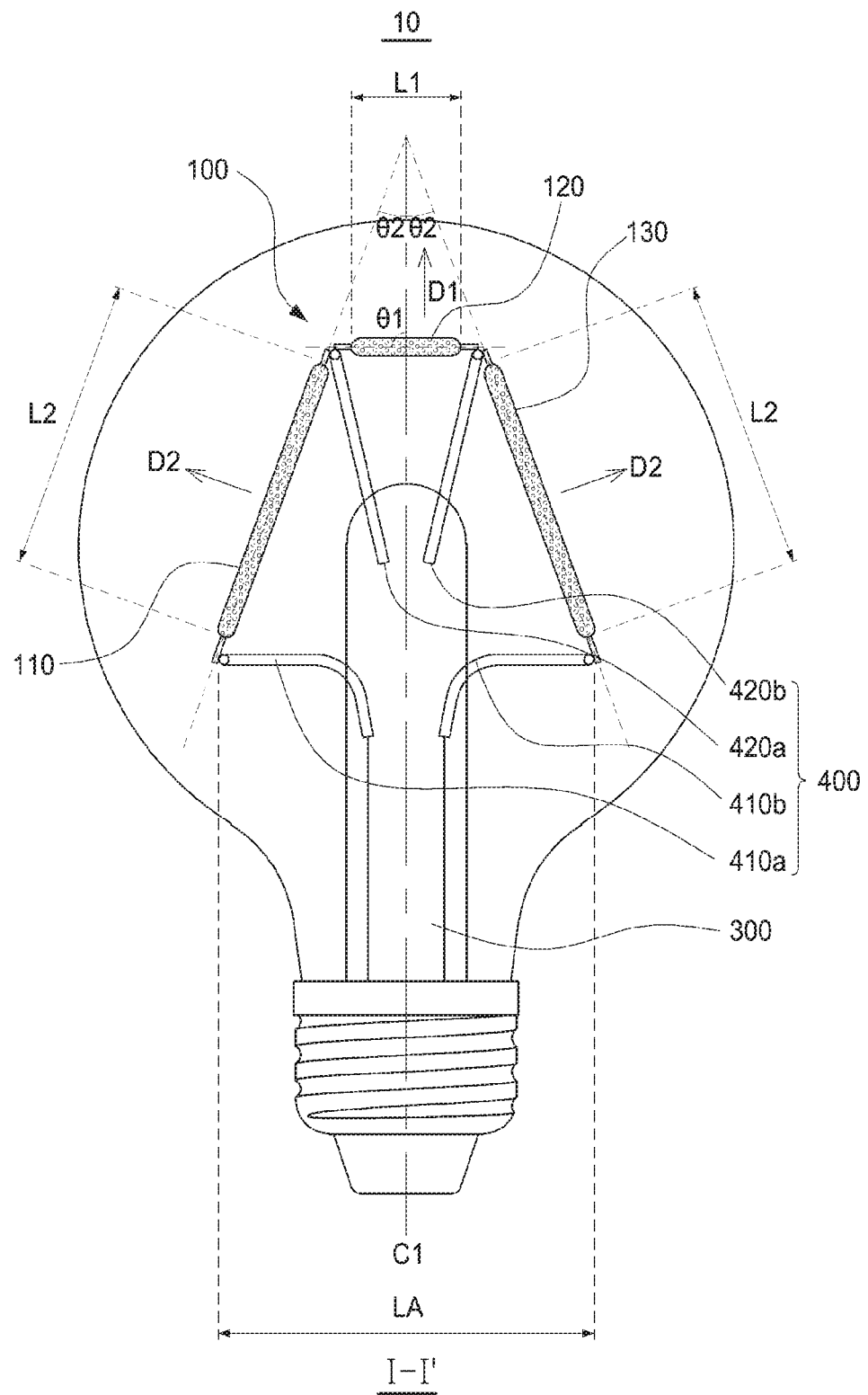
FIG. 2 is a side cross-sectional view taken along line I-I' of FIG. 1.
Figure 3:
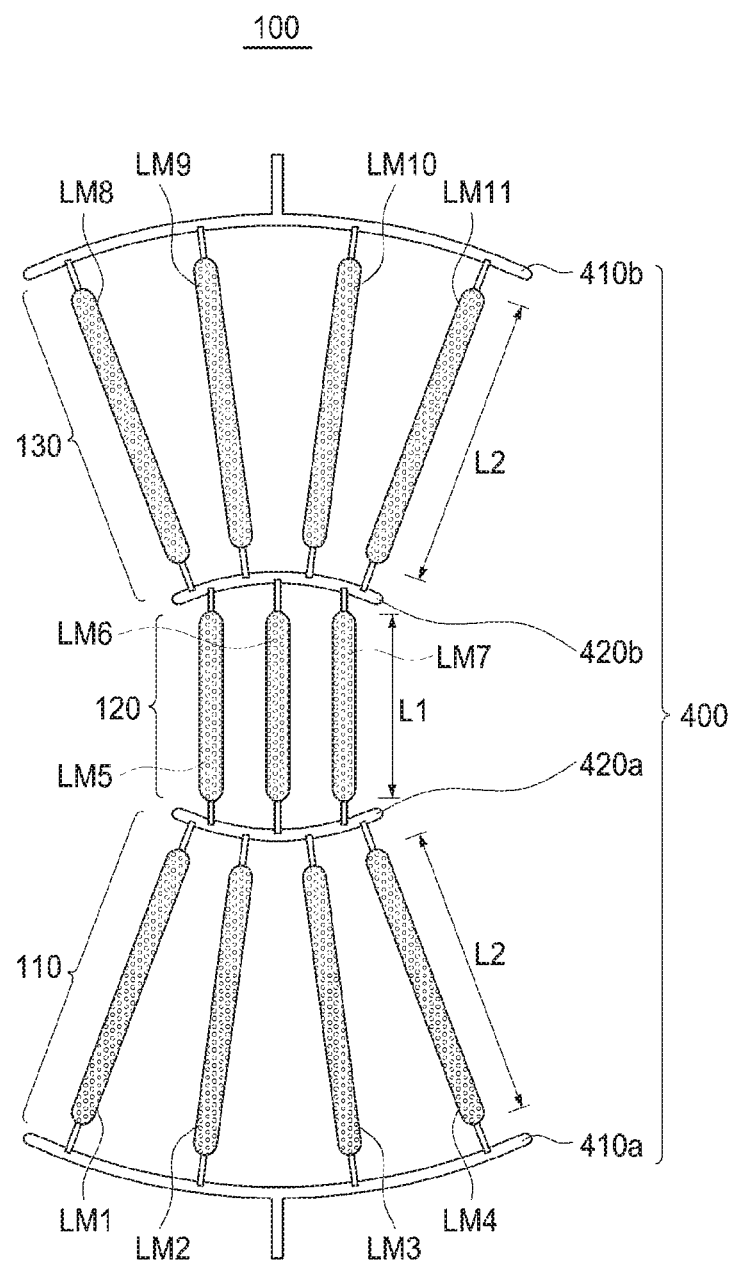
FIG. 3 is an exploded view of an LED module array of FIG. 1.
Figure 4:
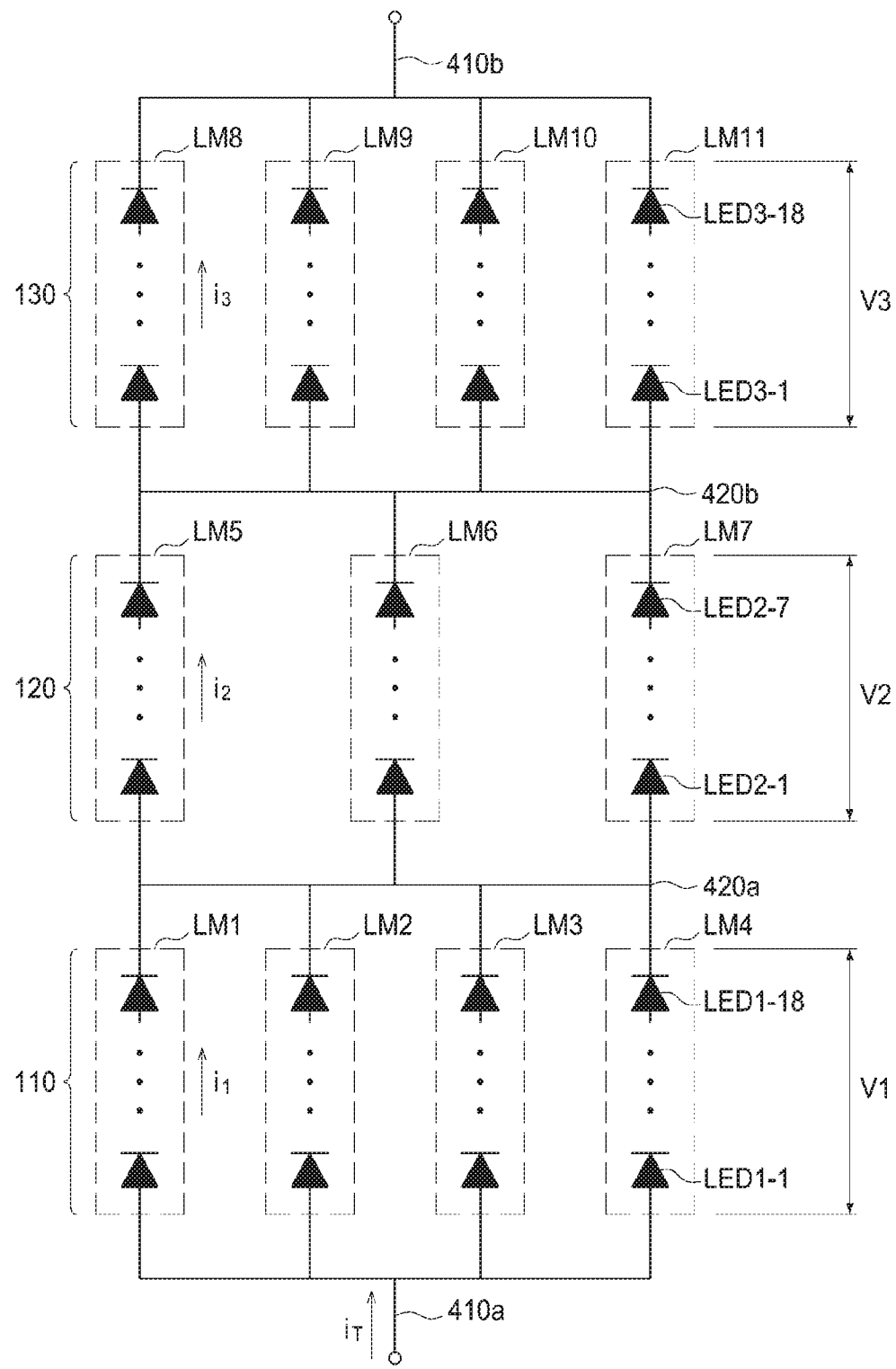
FIG. 4 is a circuit diagram of the LED module array of FIG. 3.

FIG. 1 is a perspective view of a light emitting diode (LED) lamp according to an exemplary embodiment of the present inventive concept, and FIG. 2 is a side cross-sectional view taken along line I-I' of FIG. 1. FIG. 3 is an exploded view of an LED module array of FIG. 1, and FIG. 4 is a circuit diagram of an LED module array of FIG. 3.

Referring to FIGS. 1 and 3, an LED lamp 10 may include a bulb 200, a base 600 at one end of the bulb 200, and an LED module array 100 in an internal space of the bulb 200 and having a plurality of LED modules LM1 to LM11. The plurality of LED modules LM1 to LM11 may form a plurality of LED groups 110, 120, and 130 connected in series. In the present embodiment, the case in which a single LED module array 100 is disposed in a single bulb 200 is illustrated by way of example; however, the inventive concept is not limited thereto. According to an exemplary embodiment of the inventive concept, a plurality of LED module arrays may be disposed in the single bulb 200, and the plurality of LED module arrays may emit light of different color temperatures.

The bulb 200 may be a cover formed of glass, hard glass, quartz glass, or a light transmitting resin, and may be transparent, milky, matte, or colored. A type of the bulb 200 may include bulb covers of a lighting device, such as an A-type, a G-type, an R-type, a PAR-type, a T-type, an S-type, a candle-type, a P-type, a PS-type, a BR-type, an ER-type, or a BRL-type bulb type cover.

The base 600 is combined with the bulb 200, thereby forming an outer cover of the LED lamp 10. In addition, the base is configured to be applied to a socket such as an E40, an E27, an E26, an E14, a GU, a B22, a BX, a BA, an EP, an EX, a GY, a GX, a GR, a GZ, a G-type socket, or the like. Power applied to the LED lamp 10 may be supplied through the base 600. A power supply unit 700 is disposed in an internal space of the base 600 to convert alternating current (AC) power to direct current (DC) power, applied through the base 600, or to change a voltage, thereby supplying power to the LED module array 100.

On a central axis C1 passing through a central region of the base 600 from one end to another end of the bulb 200, there is disposed a pillar 300 that can accommodate a frame 400 that secures the plurality of LED modules LM1 to LM11 of the LED module array 100. Thus, when viewed along the central axis C1, the plurality of LED modules LM1 to LM11 connected to the pillar 300 may be disposed in a central region of the bulb 200.

The pillar 300 is formed of a glass, a hard glass, a quartz glass, or a light transmitting resin, similar to the bulb 200. Therefore, the pillar 300 may transmit light emitted from the LED module array 100. The pillar 300 covers an open region of the bulb 200. To seal the internal space of the bulb 200, welding is performed through a high temperature heat treatment. Thus, the LED module array 100 disposed in the internal space of the bulb 200 may be protected from external moisture, or the like.

The frame 400 may be formed of a conductive metal. The frame 400 may include a first connection frame 420a and a second connection frame 420b connecting the plurality of LED groups 110, 120, and 130 of the LED module array 100 while supporting the LED module array 100. The frame 400 may also include a first electrode frame 410a and a second electrode frame 410b disposed at both ends of the LED module array 100 to supply power to the plurality of LED modules LM1 to LM11. For example, the first electrode frame 410a and the second electrode frame 410b may be disposed at a bottom portion of the LED module array 100. The first connection frame 420a and the second connection frame 420b may be disposed at a top portion of the LED module array 100. A portion of each of the first connection frame 420a and the second connection frame 420b as well as the first electrode frame 410a and the second electrode frame 410b may be inserted into and fixed to the pillar 300. In addition, each of the first electrode frame 410a and the second electrode frame 410b is embedded in the pillar 300 and connected to a first wire 500a and a second wire 500b connected to the power supply unit 700. Therefore, power may be supplied from the power supply unit 700 to the LED module array 100. According to an exemplary embodiment of the inventive concept, the power supply unit 700 may apply power to selectively drive a plurality of LED module arrays emitting light with different color temperatures, and may apply power to simultaneously drive a plurality of LED module arrays. In addition, a ratio of voltages or currents applied to a plurality of LED module arrays may be adjusted to emit different amounts of light, while simultaneously driving a plurality of LED module arrays emitting light with different color temperatures.

As illustrated in FIGS. 2 and 3, the LED module array 100 may be accommodated in an internal space of the bulb 200. The LED module array 100 may include the plurality of LED modules LM1 to LM11 each having a rod shape, and the plurality of LED modules LM1 to LM11 may be configured to form the plurality of LED groups 110, 120, and 130. Each of the LED groups 110, 120 and 130 may include a single LED module or a plurality of LED modules. When each of the LED groups 110, 120 and 130 includes a plurality of LED modules, for the LED modules in the same LED group to emit light in the same direction, that plurality of LED modules may be disposed in parallel in a lengthwise direction. In this case, the plurality of LED groups 110, 120, and 130 may be electrically connected to each other in series through the first connection frame 420a and the second connection frame 420b.

In each of the plurality of LED modules LM1 to LM11, connection terminals are exposed at both ends. In addition, a middle of each of the LED modules LM1 to LM11 may have an elongated rod shape covered with a wavelength conversion portion. The LED modules LM1 to LM11 may have a similar shape as that of a filament of an incandescent lamp. Here, when power is applied, a linear light fixture emits light in a manner similar to that of a filament. In this case, the LED module may be referred to as an LED filament.

For example, the LED module array 100 is configured to allow the plurality of LED groups 110, 120, and 130 to be electrically connected to each other in series. In addition, a first LED group 110 and a third LED group 130 may have the same number of LED modules, while a second LED group 120 may have a different number of LED modules compared to the first and third LED groups 110 and 130.

Each of the first, second and third LED groups 110, 120 and 130 may include at least a single LED module. When the first, second and third LED groups 110, 120 and 130 include a plurality of LED modules, the plurality of LED modules may be electrically connected to each other in parallel within each group. In the present embodiment, the case in which the LED module array 100 is formed of three LED groups with the first and third LED groups 110 and 130 being different from the second LED group 120 is illustrated by way of example; however, the inventive concept is not limited thereto. For example, the LED module array 100 may be configured with two LED groups like the second LED group 120 and one LED group like the first LED group 110. In addition, more than one LED group may be disposed at both ends of the second LED group 120.

The first, second and third LED groups 110, 120 and 130 may be disposed at different angles with respect to the central axis C1, in an internal space of the bulb 200. For example, as illustrated in FIGS. 2 and 3, the second LED group 120 may be disposed to form an angle θ1 in a length direction of the LED modules LM5 to LM7 to be greater than an angle θ2 formed in a length direction of LED modules LM1 to LM4 and LM8 to LM11 of the first and third LED groups 110 and 130. Thus, the first and third LED groups 110 and 130 disposed in a side surface of the bulb 200 may be disposed to have the same light distribution direction D2 with respect to the central axis C1, and the second LED group 120 may have the same light distribution direction D1 as the central axis C1. Here, a light distribution direction may be a direction perpendicular to a length direction of an LED module. In other words, a direction in which light emitted from an LED module is irradiated.

In addition, the LED modules LM5 to LM7 included in the second LED group 120 may be disposed in parallel, perpendicular to the central axis C1.

Figure 10:
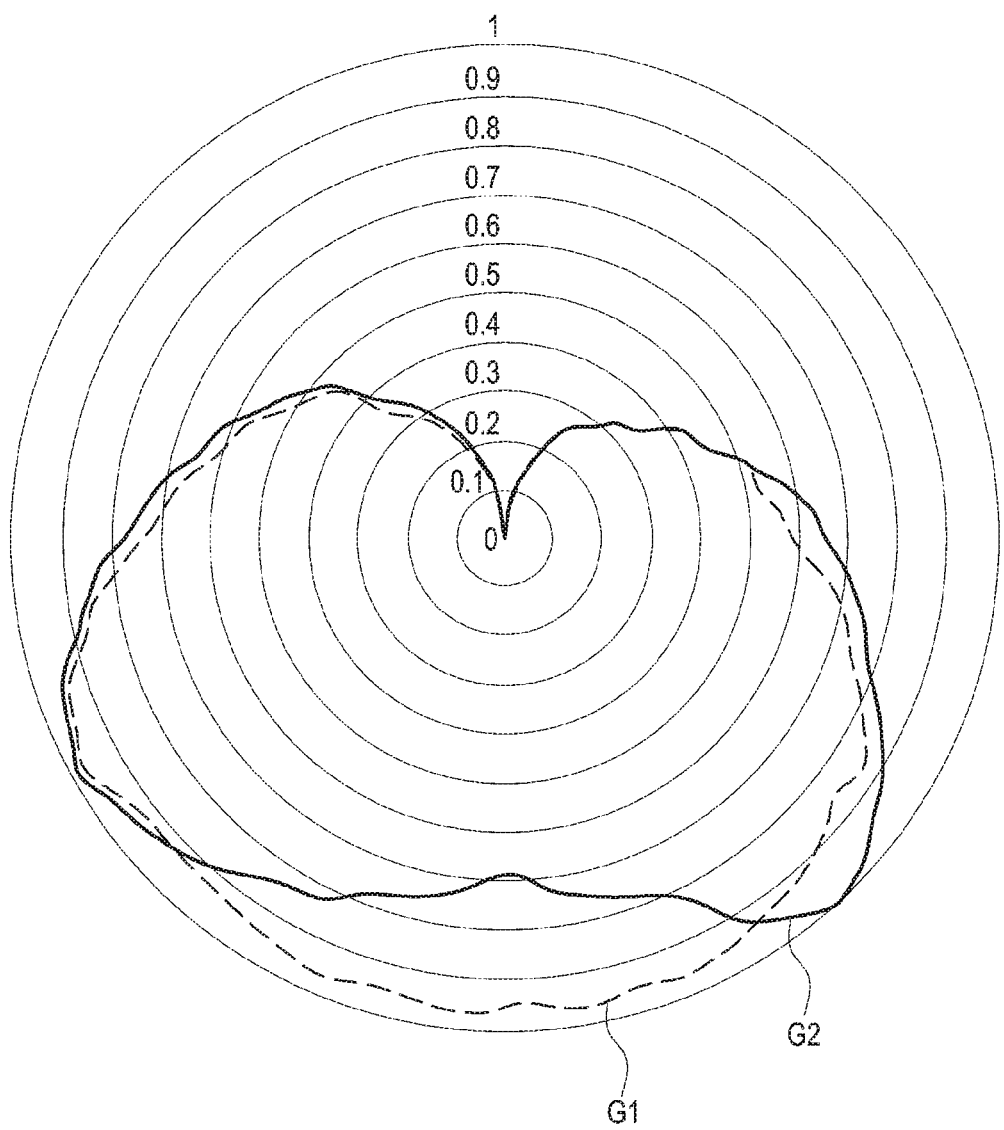
FIG. 10 is a graph comparing light distribution of an exemplary embodiment of the present inventive concept and the Comparative Example.

Thus, as illustrated in FIG. 10, the LED module array 100 according to an exemplary embodiment of the inventive concept may have light distribution G1 in which light emitted in a direction of the central axis C1 is increased. Thus, compared to light distribution G2 of an LED module array in which an LED module is not disposed on the central axis C1, light distribution may be uniform. Thus, in the case of the present embodiment, light distribution that is more similar to that of a filament used in an incandescent lamp may be obtained.

In addition, a length and/or the number of LED modules LM5 to LM7 included in the second LED group 120 may be different from a length and/or the number of LED modules LM1 to LM4 and LM8 to LM11 included in the first and third LED groups 110 and 130. For example, the number of LED modules included in the second LED group 120 may be less than the number of LED modules included in each of the first and third LED groups 110 and 130. In addition, a length of LED modules included in the second LED group 120 may be shorter than a length of LED modules included in the first and third LED groups 110 and 130. Here, a length of an LED module may be a length of the LED module except for a length of its connection terminals. According to an exemplary embodiment of the inventive concept, a plurality of LED chips included in an LED module having a short length may be replaced with a semiconductor light emitting device having a multijunction structure.

When the LED module array 100 described above is disposed in the bulb 200, since the bulb 200 has a narrow inlet, a width LA of the LED module array 100 to be disposed in the bulb 200 is limited (refer to FIG. 2). When the LED module array 100 includes three or more LED groups, a total length of the LED module array 100 is increased. Therefore, the width LA of the LED module array 100 disposed in the bulb 200 is also increased. Thus, the LED module array 100 may not be disposed in a bulb of an incandescent lamp. In an exemplary embodiment of the inventive concept, a length of an LED module included in the second LED group 120 disposed on the central axis C1 is shorter than a length of an LED module included in the first and third LED groups 110 and 130. Therefore, an increase in the width LA of the LED module array 100 is significantly reduced. Thus, the LED module array 100 can be disposed in a bulb of an incandescent lamp.

In the present embodiment, a length L1 of the second LED group 120 disposed between the first and third LED groups 110 and 130 may be shorter than a length L2 of each of the first and third LED groups 110 and 130.

In addition, the number of LED modules LM5 to LM7 of the second LED group 120 may be smaller than the number of LED modules LM1 to LM4 and LM8 to LM11 of the first and third LED groups 110 and 130.

In addition, the number of LED chips included in each of the LED modules LM5 to LM7 of the second LED group 120 may be smaller than the number of LED chips included in each of the LED modules LM1 to LM4 and LM8 to LM11 of the first and third LED groups 110 and 130.

In addition, a distance between LED chips included in each of the LED modules LM5 to LM7 of the second LED group 120 may be smaller than a distance between LED chips included in each of the LED modules LM1 to LM4 and LM8 to LM11 of the first and third LED groups 110 and 130.

In the present embodiment, a case in which the second LED group 120 includes three LED modules and each of the first and third LED groups 110 and 130 includes four LED modules is illustrated; however, the inventive concept is not limited thereto.

The LED module array 100 having a configuration described above can emit the same total amount of light as compared to an LED module array in which an LED module is not disposed on the central axis C1. Therefore, manufacturing costs are reduced, and light distribution and heat dissipation characteristics are increased. This will be described in detail, referring to FIGS. 4 and 9.

FIG. 4 is a circuit diagram of the LED module array 100 illustrating the electrical connection relationship of the second LED group 120 and the first and third LED groups 110 and 130. The first, second and third LED groups 110, 120 and 130 are connected to each other in series. In FIG. 4, a case in which each of LED modules LM5 to LM7 of the second LED group 120 includes seven LED chips LED2-1 to LED2-7 and each of LED modules LM1 to LM4 and LM8 to LM11 of the first and third LED groups 110 and 130 includes eighteen LED chips LED1-1, LED1-18, LED3-1, and LED3-18 is illustrated by way of example.

When $i_T$ of FIG. 4 is 60 mA, a current $i_1$ flowing in each of the LED modules LM1 to LM4 of the first LED group 110 is 15 mA, a current $i_2$ flowing in each of the LED modules LM5 to LM7 of the second LED group 120 is 20 mA, and a current $i_3$ flowing in each of the LED modules LM8 to LM11 of the third LED group 130 is 15 mA. When power consumption is calculated in consideration of the number of LED chips mounted on each LED module, it is confirmed that each of the LED modules LM5 to LM7 of the second LED group 120 consumes 0.58 W of power and each of the LED modules LM1 to LM4 and LM8 to LM11 of the first and third LED groups 110 and 130 consumes 0.83 W of power. When an amount of emitted light is calculated from the power consumption, each of the LED modules LM5 to LM7 of the second LED group 120 emits 66 lm of light, and each of the LED modules LM1 to LM4 and LM8 to LM11 of the first and third LED groups 110 and 130 emits 100 lm of light. Thus, the second LED group 120 emits 200 lm of light, and each of the first and third LED groups 110 and 130 emits 400 lm of light.

Figure 9:
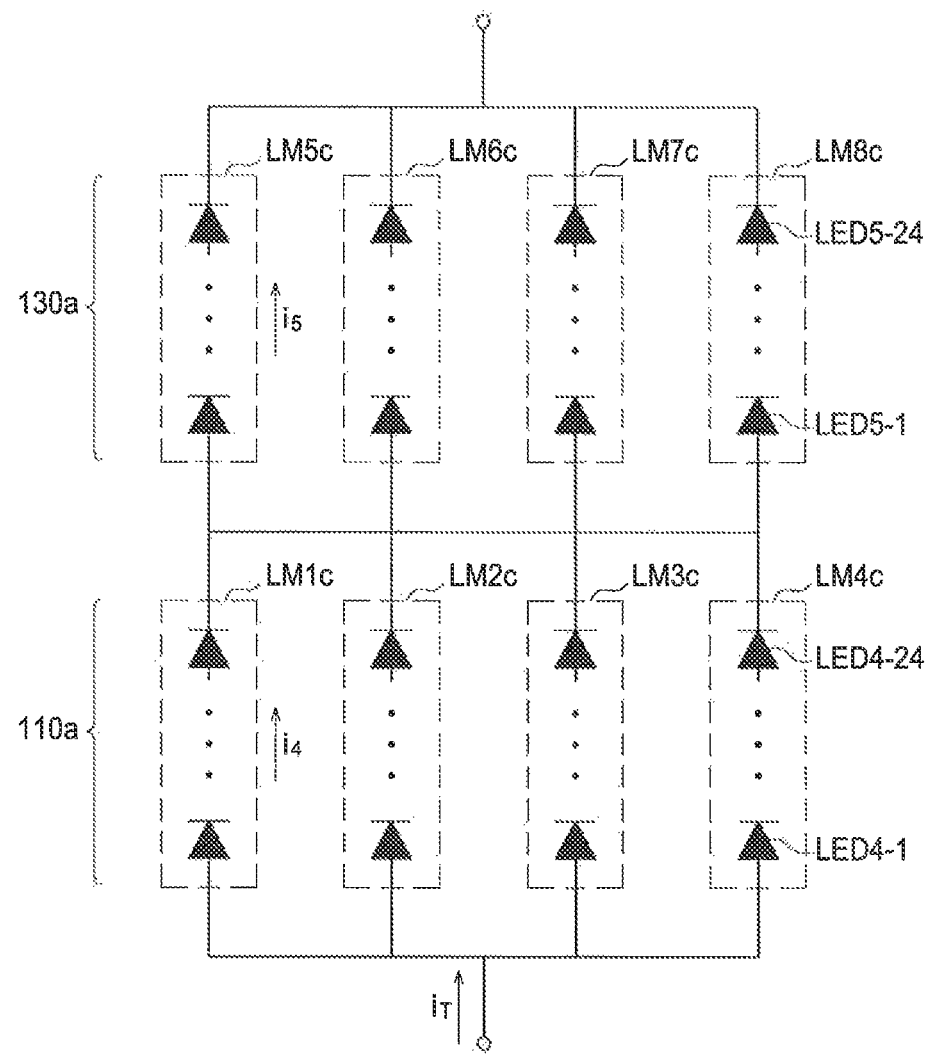
FIG. 9 is a circuit diagram of an LED module array of a Comparative Example.

On the other hand, in the comparative example of FIG. 9, two LED groups 110a and 130a are connected to each other in series, and four LED modules LM1c to LM8c are included in each of LED groups 110a and 130a. In addition, 24 LED chips (e.g., LED4-1 to LED4-24) and (e.g., LEDS-1 to LEDS-24) are included in each of LED modules LM1c to LM8c. When $i_T$ is 60 mA, each current $i_4$ and $i_5$, flowing in each of the LED modules LM1c to LM8c of the LED groups 110a and 130a, is 15 mA. When power consumption is calculated in consideration of the number of LED chips mounted on each LED module, each of the LED groups 110a and 130a consumes 1.04 W of power. When an amount of emitted light is calculated from the power consumption, each of the LED modules LM1c to LM8c of the LED groups 110a and 130a emits 125 lm of light. Thus, each of the LED groups 110a and 130a emits 500 lm of light.

Thus, the embodiment of FIG. 4 and the comparative example of FIG. 9 emit the same total amount of light such as 1000 lm, but the number of LED chips in FIG. 4 is 186 and the number of LED chips of the comparative example is 192. Thus, the number of LED chips of FIG. 4 is small compared to the number of LED chips of the comparative example. In addition, when the number of mounted chips decreases, a length of a circuit board required for mounting an LED chip is reduced. Therefore, manufacturing costs of an LED module may be reduced.

In addition, in the embodiment of the inventive concept, as described previously, the second LED group 120 is disposed on the central axis C1, thus light distribution may be increased compared to the comparative example. In addition, in the embodiment of the inventive concept, since the number of LED chips is reduced, heat emitted from an LED module array may be reduced. Moreover, as the number of LED modules is increased, an area in contact with air increased. Therefore, heat dissipation efficiency is increased and a heat dissipation effect is increased as well.

Figure 8:
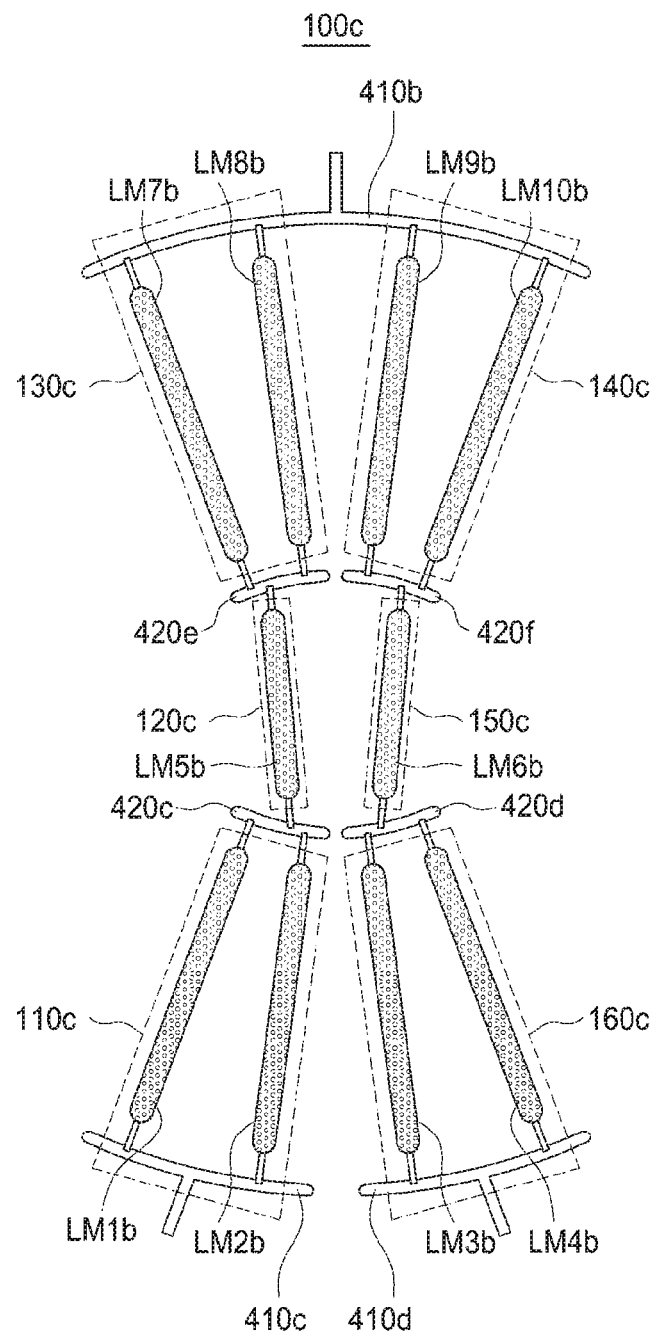
FIG. 8 is an exploded view of a modified example of the LED module array of FIG. 3.

FIG. 8 is an exploded view illustrating an LED module array in which the number of LED groups is increased, as a modified example of the LED module array 100 of FIG. 3.

Referring to FIG. 8, in an LED module array 100c according to an exemplary embodiment of the inventive concept, compared to the embodiment of FIG. 3, the first electrode frame is divided into two first electrode frames 410c and 410d, and each of the first connection frame and the second connection frame is divided into two first connection frames 420c and 420d as well as two second connection frames 420e and 420f. Therefore, there is an increase in the number of LED groups included in an LED module array. When compared to FIG. 3, the number of LED modules LM1b to LM10b included in FIG. 8 is decreased by one, but the number of LED groups 110c, 120c, 130c, 140c, 150c, and 160c connected in series is increased to six, from three. In the case of FIG. 8, power is applied through the divided first electrode frames 410c and 410d.

Figure 5:
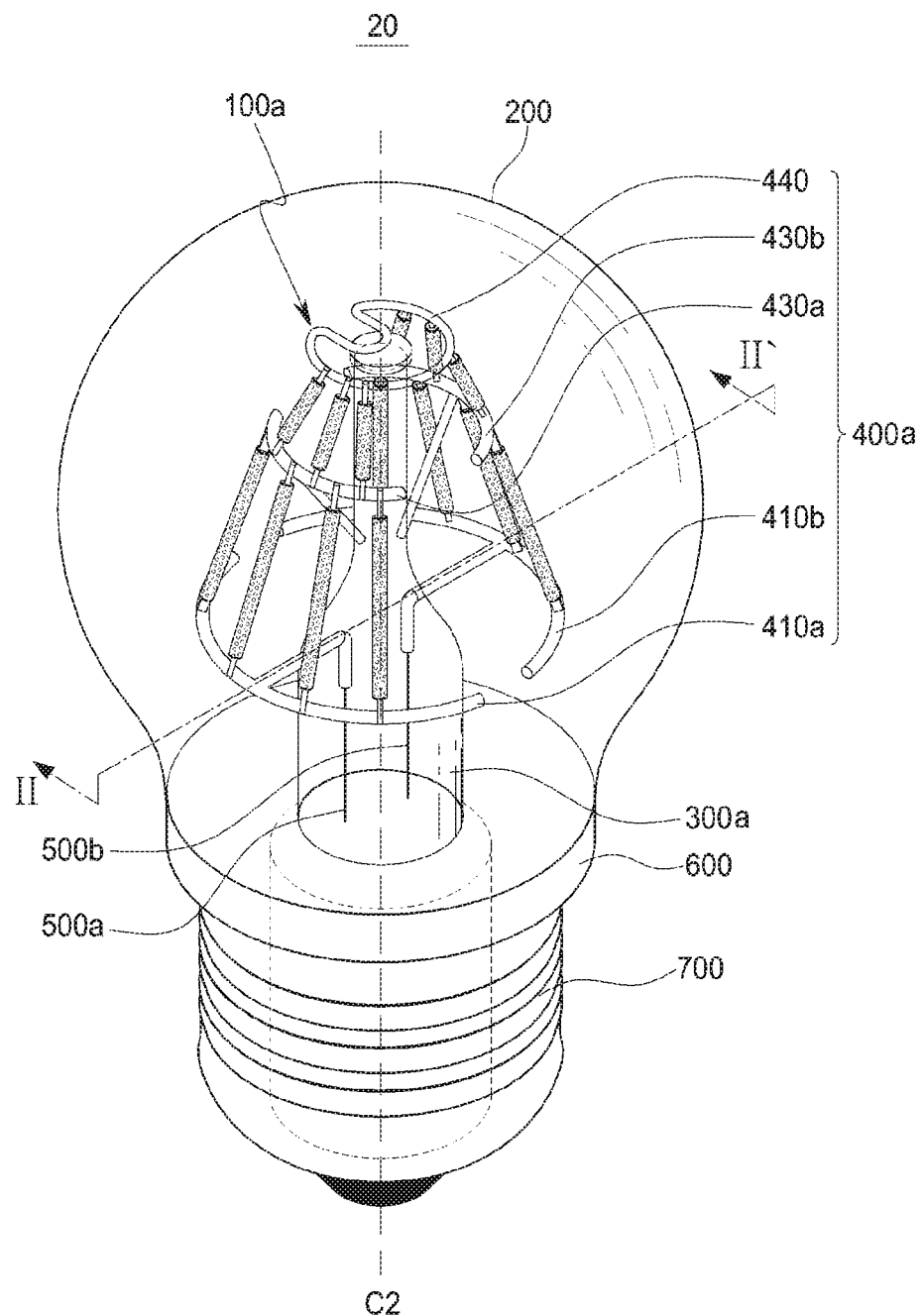
FIG. 5 is a perspective view of an LED lamp according to an exemplary embodiment of the present inventive concept.
Figure 6:
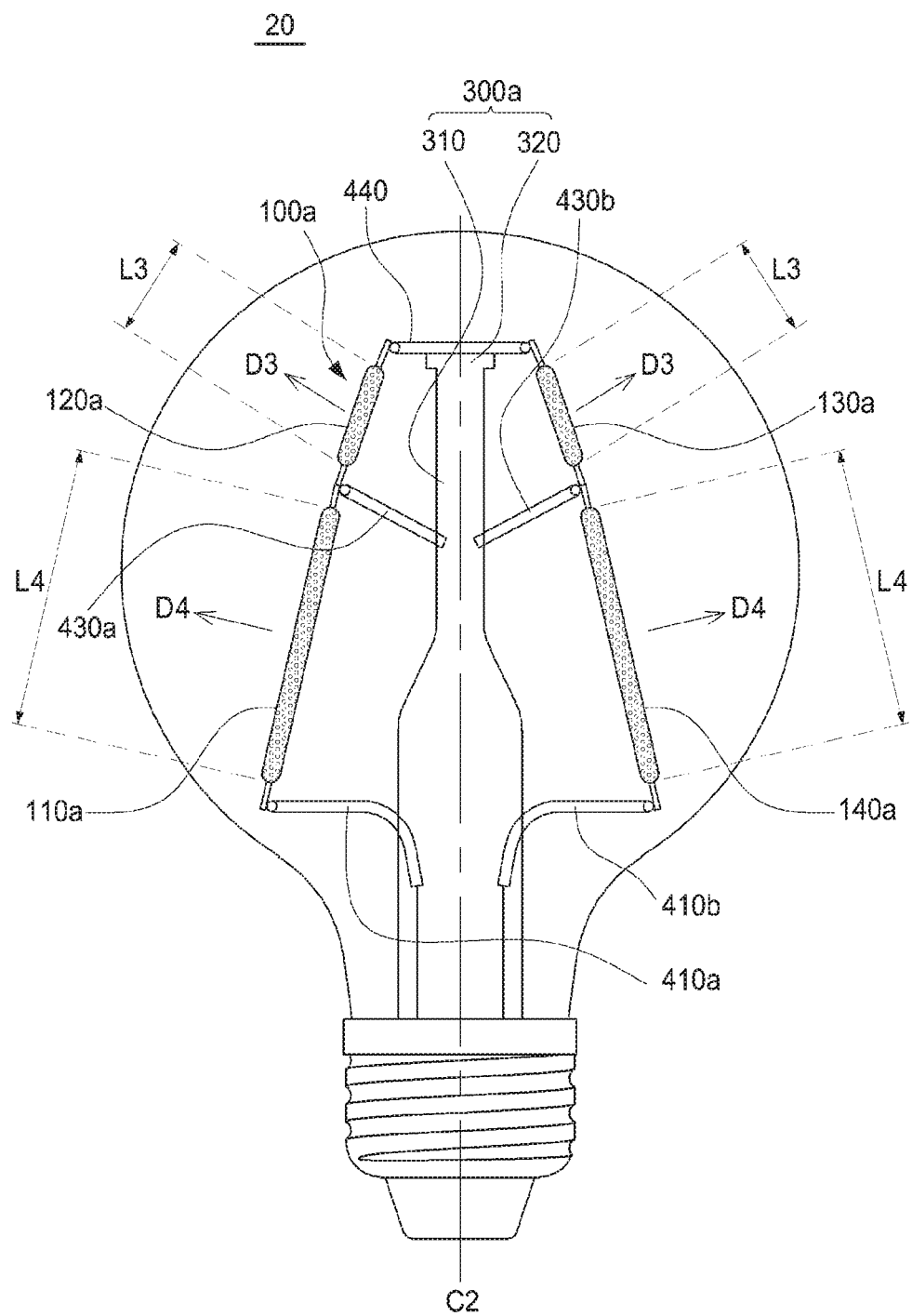
FIG. 6 is a side cross-sectional view taken along line II-II' of FIG. 5.
Figure 7:
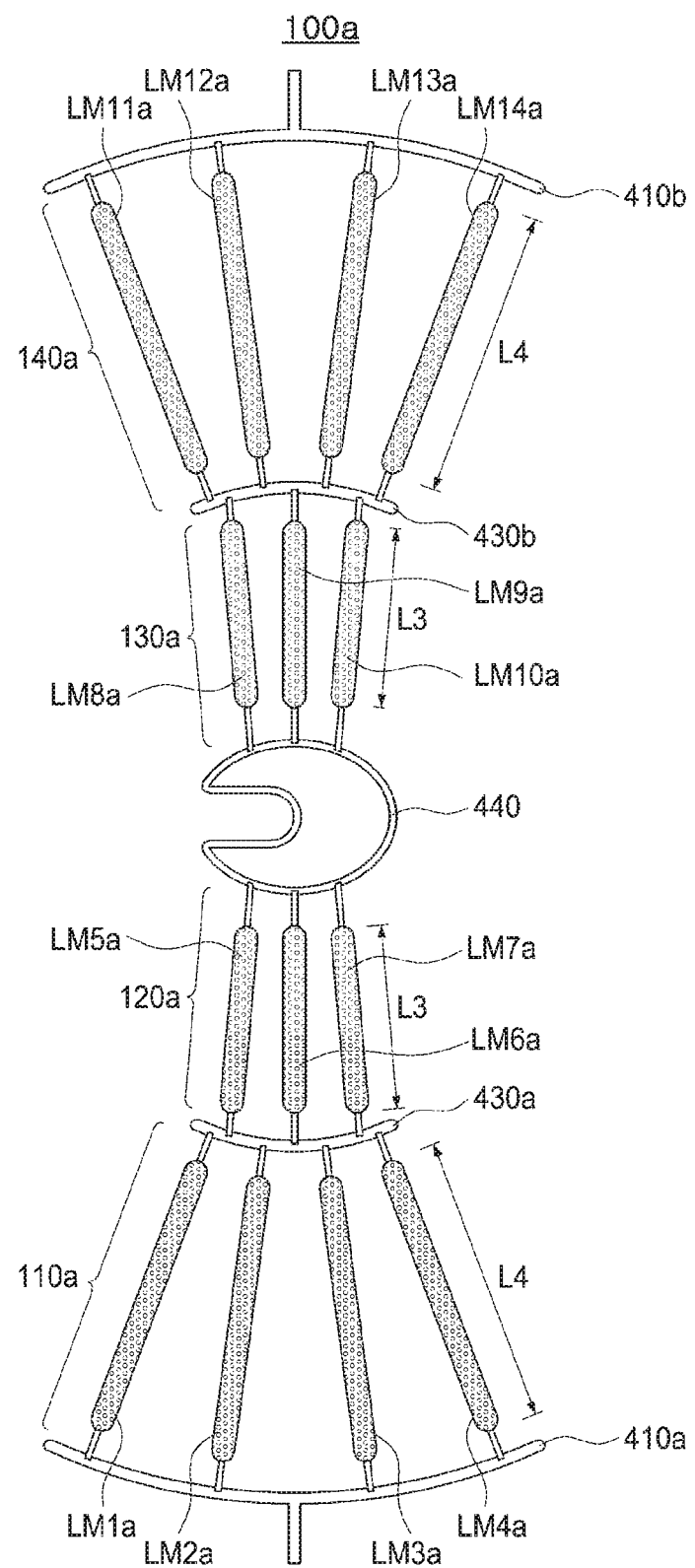
FIG. 7 is an exploded view of an LED module array of FIG. 5.

FIGS. 5 through 7 illustrate an LED lamp 20 having an LED module array with a structure different from the previously described exemplary embodiments. FIG. 5 is a perspective view of an LED lamp according to an exemplary embodiment of the present inventive concept, FIG. 6 is a side cross-sectional view taken along line II-II' of FIG. 5, and FIG. 7 is an exploded view of an LED module array of FIG. 5.

Referring to FIGS. 5-7, the LED lamp 20 according to the present embodiment may include a bulb 200, a base 600 at one end of the bulb 200, and an LED module array 100a in an internal space of the bulb 200 and having a plurality of LED modules LM1a to LM14a. The LED module array 100a may be similar to the LED module array 100 illustrated in FIG. 1, but the number and arrangement of the LED modules LM1a to LM14a is different. In addition, the configuration of a pillar 300a and a frame 400a are different.

The LED module array 100a is different in that it includes first, second, third and fourth LED groups 110a, 120a, 130a and 140a, compared to the LED module array 100 described above. In the embodiment of FIGS. 1-3, for example, the second LED group 120 is disposed on the central axis C1. However, in the present embodiment, there are two LED groups where the second LED group 120 was located. In addition, the second and third LED groups 120a and 130a are symmetrically disposed to have the same light distribution direction D3 with respect to a central axis C2. The first and fourth LED groups 110a and 140a are disposed to have the same light distribution direction D4 with respect to the central axis C2, similar to that described above for the first and third groups 110 and 130. Also similar to the embodiment of FIGS. 1-3, for example, a length L3 of the second and third LED groups 120a and 130a, disposed between the first and fourth LED groups 110a and 140a, may be shorter than a length L4 of the first and fourth LED groups 110a and 140a. In addition, the number of LED modules LM5a to LM7a and LM8a to LM10a of the second and third LED groups 120a and 130a may be smaller than the number of LED modules LM1a to LM4a and LM11a to LM14a of the first and fourth LED groups 110a and 140a.

In addition, the frame 400a of the present embodiment further includes a third connection frame 440, compared to the frame 400 of FIGS. 1-3, for example. In addition, the pillar 300a may further include a seating portion 320 for supporting the third connection frame 440. The first electrode frame 410a and the second electrode frame 410b are fixed to a middle 310 of the pillar 300a, thereby supporting the LED modules LM1a to LM4a and LM11a to LM14a welded to the first electrode frame 410a and the second electrode frame 410b. Moreover, the first electrode frame 410a and the second electrode frame 410b are connected to the first wire 500a and the second wire 500b embedded in the pillar 300a, respectively. Therefore, power supplied from the power supply unit 700 may be applied thereto.

Figure 11:
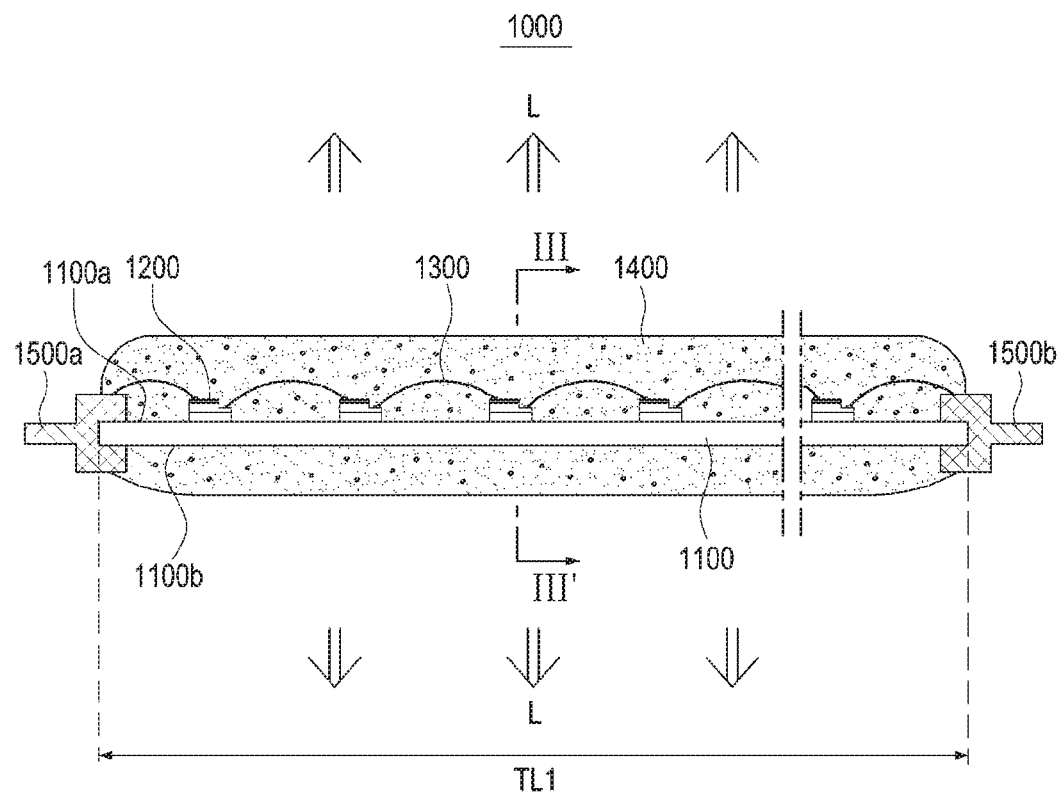
FIG. 11 is a side cross-sectional view of an LED module according to an exemplary embodiment of the present inventive concept.
Figure 12:
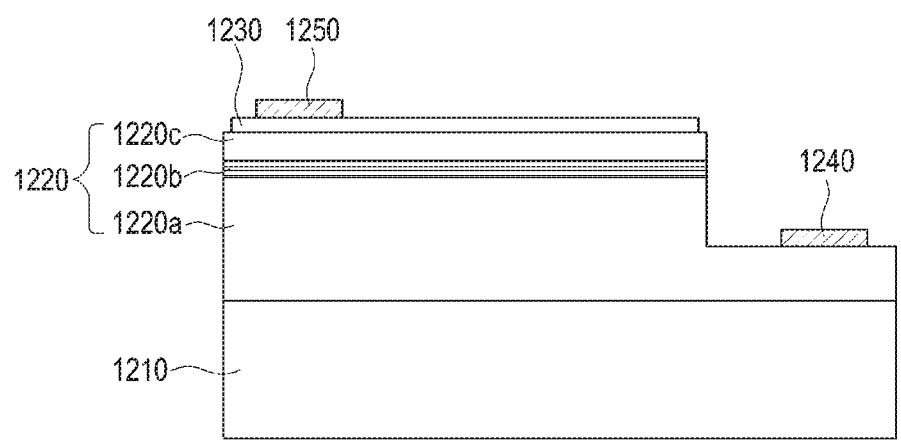
FIG. 12 is an enlarged view of an LED chip of FIG. 11.

FIG. 11 is a side cross-sectional view illustrating an LED module according to an exemplary embodiment of the inventive concept, and FIG. 12 is an enlarged view of the LED module illustrated in FIG. 11.

Referring to FIGS. 11 and 12, an LED module 1000 may include an LED chip 1200, a circuit board 1100 on which the LED chip 1200 is mounted, a wavelength conversion portion 1400 surrounding the LED chip 1200, as well as a first connection terminal 1500a and a second connection terminal 1500b connected to the LED chip 1200 for applying power.

The circuit board 1100 has a first surface 1100a on which the LED chip 1200 is mounted and a second surface 1100b opposing each other. The circuit board 1110 may have a plate shape elongated in one direction. The circuit board 1100 may be a transparent substrate manufactured using glass, hard glass, quartz glass, a transparent ceramic, sapphire, plastic, or the like. According to an exemplary embodiment of the inventive concept, the circuit board 1100 may be formed of the same material as that of a transparent support substrate of the LED chip 1200.

Referring to FIG. 12, the LED chip 1200 may include a light emitting structure 1220 having a first conductivity-type semiconductor 1220a, an active layer 1220b with a multiple quantum well structure, and a second conductivity-type semiconductor 1220c, sequentially disposed on a light-transmitting substrate 1210.

The light-transmitting substrate 1210 may be a substrate for semiconductor growth and may be formed of a material such as sapphire, SiC, $MgAl_2O_4$, MgO, $LiAlO_2$, $LiGaO_2$, GaN, or the like. In the case of sapphire, as a crystal body having Hexa-Rhombo R3c symmetry, lattice constants in the c-axis direction and in the a-axis direction are 13.000 Å and 4.758 Å, respectively, and the sapphire has a C(0001) plane, an A(11-20) plane, a R(1-102) plane, or the like. In this case, the C plane is mainly used as a substrate for nitride growth, since a nitride thin film grows relatively easily thereon and the C plane is stable at high temperatures.

The light-transmitting substrate 1210 may have surfaces opposing each other, and a concave-convex structure may be formed in at least one of the surfaces opposing each other. The concave-convex structure may be formed by etching a portion of the light-transmitting substrate 1210. Alternatively, the concave-convex structure may be obtained by using a different material than the light-transmitting substrate 1210.

The first conductivity-type semiconductor 1220a may be a nitride semiconductor satisfying n-type $Al_xIn_yGa_{1-x-y}N$ ($0 \leq x < 1$, $0 \leq y < 1$, $0 \leq x+y < 1$), and an n-type impurity may be silicon (Si). The second conductivity-type semiconductor 1220c may be a nitride semiconductor satisfying p-type $Al_xIn_yGa_{1-x-y}N$ ($0 \leq x < 1$, $0 \leq y < 1$, $0 \leq x+y < 1$), and a p-type impurity may be magnesium (Mg). For example, the first conductivity-type semiconductor 1220a may include an n-type GaN, and the second conductivity-type semiconductor 1220c may include a p-type GaN. In addition, the second conductivity-type semiconductor 1220c may have a monolayer structure. However, the inventive concept is not limited thereto and the second conductivity-type semiconductor 1220c may have a multilayer structure having different compositions.

The active layer 1220b may have a multiple quantum well (MQW) structure in which a quantum well layer and a quantum barrier layer are alternately stacked on each other. For example, the quantum well layer and the quantum barrier layer may be formed of $Al_xIn_yGa_{1-x-y}N$ ($0 \leq x \leq 1$, $0 \leq y \leq 1$, $0 \leq x+y \leq 1$) having different compositions. For example, the quantum well layer may be $In_xGa_{1-x}N$ ($0 < x \leq 1$), and the quantum barrier layer may be GaN or AlGaN.

The LED chip 1200 may include a first electrode 1240 disposed on the first conductivity-type semiconductor 1220a, as well as an ohmic contact layer 1230 and a second electrode 1250 sequentially disposed on the second conductivity-type semiconductor 1220c.

The first electrode 1240 and the ohmic contact layer 1230 may be formed of a material such as silver (Ag), nickel (Ni), aluminum (Al), rhodium (Rh), palladium (Pd), iridium (Jr), ruthenium (Ru), magnesium (Mg), zinc (Zn), platinum (Pt), gold (Au), or the like, and may have a monolayer or multilayer structure. However, the first electrode 1240 and the ohmic contact layer 1230 are not limited thereto. In an exemplary embodiment of the inventive concept, the first electrode 1240 may include Cr/Au as a contact electrode layer. The first electrode 1240 may further include a pad electrode layer on a contact electrode layer. The pad electrode layer may be a Au, Sn or Au/Sn layer.

The ohmic contact layer 1230 may be variously implemented according to a chip structure. For example, in the case of a flip chip structure, the ohmic contact layer 1230 may include Ag. In the case of a conversely disposed structure, the ohmic contact layer 1230 may be formed of a transparent electrode. The transparent electrode may be a transparent conductive oxide layer or a nitride layer. For example, the transparent electrode may be made of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, as well as zinc magnesium oxide such as $Zn_{(1-x)}Mg_xO$, where $0 \leq x \leq 1$. In addition, the ohmic contact layer 1230 may include graphene. The second electrode 1250 may include Au, Sn or Au/Sn.

Referring to FIG. 11, the first connection terminal 1500a and the second connection terminal 1500b may be disposed at both ends of the circuit board 1100 to be connected to the first electrode 1240 and the second electrode 1250 of the LED chip 1200. In addition, a thermal paste for increasing thermal conductivity may be applied or a metal layer may be deposited on a surface connected to the first electrode 1240 and the second electrode 1250. The thermal paste may include a diamond with good thermal conductivity, and a filler of Ag, AlN, BN, and ZnO. The metal layer may include Au, Sn, Ag, Al, W, Ni, Cu, In, or Pb. Thus, heat emitted from the LED chip 1200 may be rapidly dissipated in the first connection terminal 1500a and the second connection terminal 1500b through the circuit board 1100.

The wavelength conversion portion 1400 may be formed to cover the first surface 1100a of the circuit board 1100 and the second surface 1100b of the circuit board 1100. In the present embodiment, the wavelength conversion portion 1400 may surround the circuit board 1100 while covering the LED chip 1200 located on an upper surface (e.g., the first surface 1100a) of the circuit board 1100. Thus, all light L emitted in upper and lower directions of the LED module 1000 may be converted into desired light by the wavelength conversion portion 1400. The wavelength conversion portion 1400 includes wavelength conversion materials having different compositions, according to an LED group included in the LED module 1000, and thus, the wavelength conversion portion 1400 may emit light with different color temperatures according to the LED group.

Figure 13:
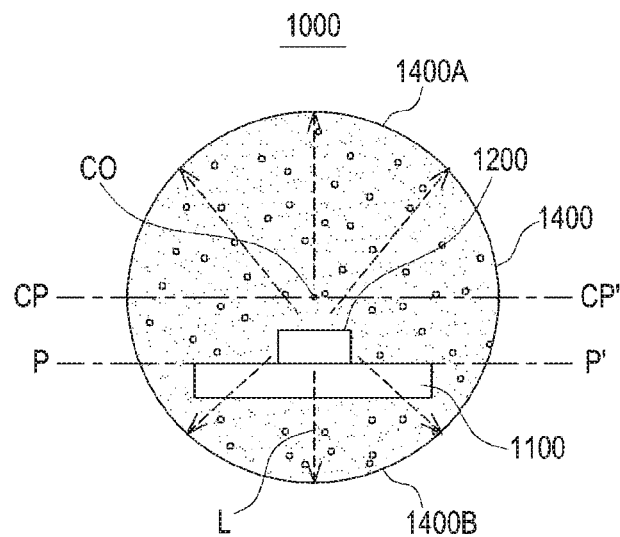
FIG. 13 is a cross-sectional view taken along line III-III' of FIG. 11.

FIG. 13 is a cross-sectional view of the LED module of FIG. 11. Referring to FIG. 13, a mounting surface P-P', from which an upper surface of the circuit board 1100 is extended, is arranged to be lower than a surface CP-CP' passing through the center C0 of the wavelength conversion portion 1400. Therefore, an area of a surface of a front portion 1400A of the wavelength conversion portion 1400 may be wider than an area of a surface of a rear portion 1400B of the wavelength conversion portion 1400. Using the arrangement described above, an amount of light emitted to an upper surface and a lower surface may be adjusted.

Figure 14:
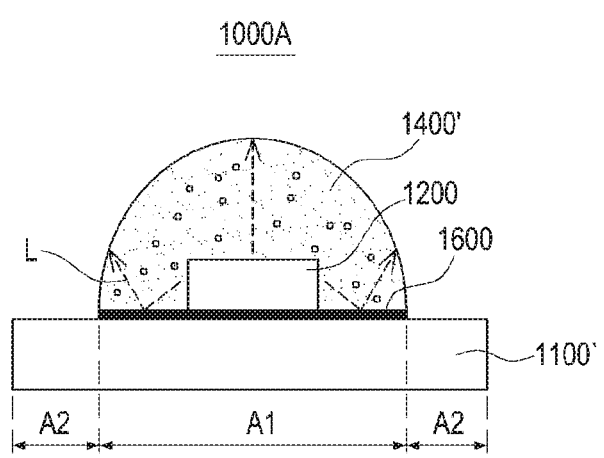
FIG. 14 is a modified example of an LED module of FIG. 13.
Figure 15:
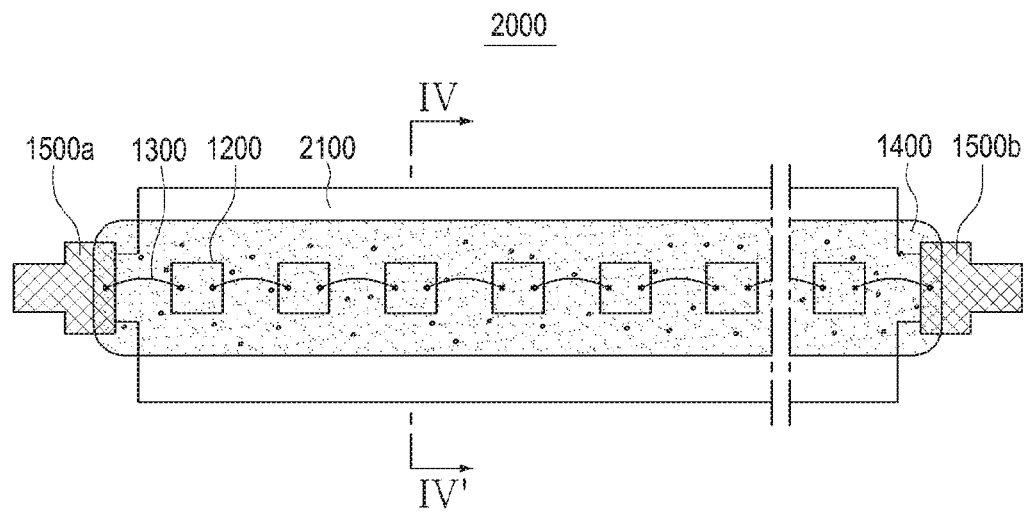
FIG. 15 is a plan view of an LED module according to an exemplary embodiment of the present inventive concept.

FIGS. 14 and 15 illustrate an LED module having a wavelength conversion portion with a different structure from the exemplary embodiment described above with reference to FIGS. 11-13, for example.

Referring to FIG. 14, an LED module 1000A according to an exemplary embodiment of the inventive concept may include an LED chip 1200, a circuit board 1100', and a wavelength conversion portion 1400' surrounding the LED chip 1200. The wavelength conversion portion 1400' may be configured similarly to a wavelength conversion portion 1400 illustrated in FIG. 17.

Compared to the embodiment of FIG. 13, the wavelength conversion portion 1400' is formed in a portion A1 of one surface of the circuit board 1100' on which the LED chip 1200 is mounted. Thus, there are differences in that both ends A2 of the circuit board 1100' are exposed. In addition, a reflective layer 1600 is disposed on the circuit board 1100'. Light L emitted from the LED chip 1200 is reflected by the reflective layer 1600, and is then emitted from a top surface thereof. Thus, the wavelength conversion portion 1400' may only be formed in a surface on which the LED chip 1200 is mounted. Thus, an amount of the wavelength conversion portion 1400' used may be reduced. In addition, a region in which the wavelength conversion portion 1400' with low heating efficiency is not disposed may be increased. Thus, heating efficiency of the LED module 1000A may be increased.

Figure 16:
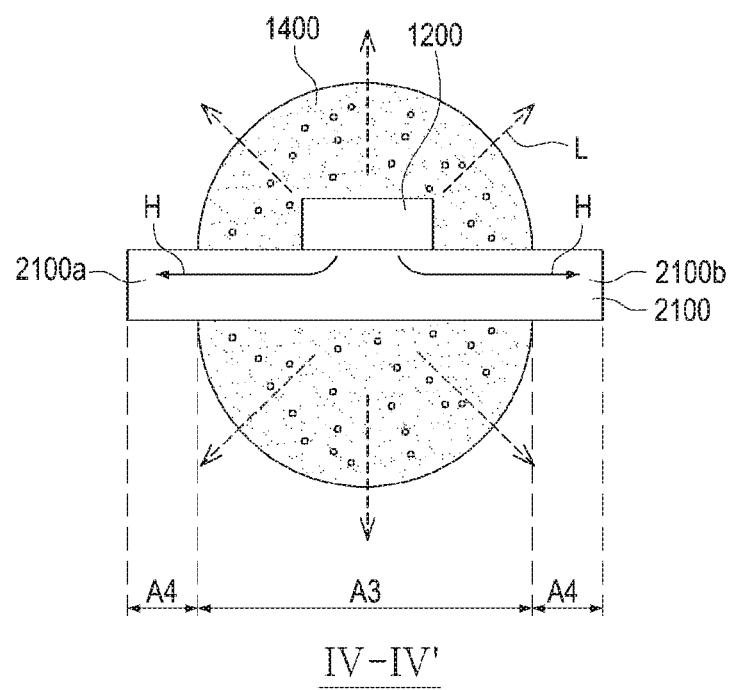
FIG. 16 is a lateral cross-sectional view taken along line IV-IV' of FIG. 15.

FIG. 15 is a plan view of an LED module according to an exemplary embodiment of the present inventive concept, and FIG. 16 is a side cross-sectional view taken along line IV-IV' of FIG. 15.

Referring to FIG. 15, an LED module 2000 according to an exemplary embodiment of the inventive concept may include a circuit board 2100, a plurality of LED chips 1200 mounted on one surface of the circuit board 2100, a wavelength conversion portion 1400 surrounding the plurality of LED chips 1200, as well as a first connection terminal 1500a and a second connection terminal 1500b connected to the LED chips 1200 for applying power.

The wavelength conversion portion 1400 may be configured similarly to the wavelength conversion portion 1400 illustrated in FIG. 11.

The plurality of LED chips 1200 may be connected in series, in parallel, or in both series and parallel with a wire 1300; however, the inventive concept is not limited thereto. Alternatively, the plurality of LED chips may be directly mounted on the circuit board 2100 in a chip-on-board (COB) form, without using a separate package. In the present embodiment, the case in which the plurality of LED chips 1200 are connected in series through the wire 1300 is shown.

The circuit board 2100 may be formed as a transparent substrate in a manner similar to the circuit board 1100 illustrated in FIG. 11. However, the circuit board 2100 may be formed of a metal substrate having excellent heating properties in accordance with an exemplary embodiment of the inventive concept. In addition, referring to FIG. 16, in the circuit board 2100, regions A4 except for a region A3 in which the wavelength conversion portion 1400 is disposed, are exposed to air. Therefore, heat H emitted from the LED chip 1200 may be rapidly dissipated. Reference numerals 2100a and 2100b correspond to portions of the circuit board 2100 where the wavelength conversion portion 1400 is not disposed in a width direction, for example.

Figure 17:
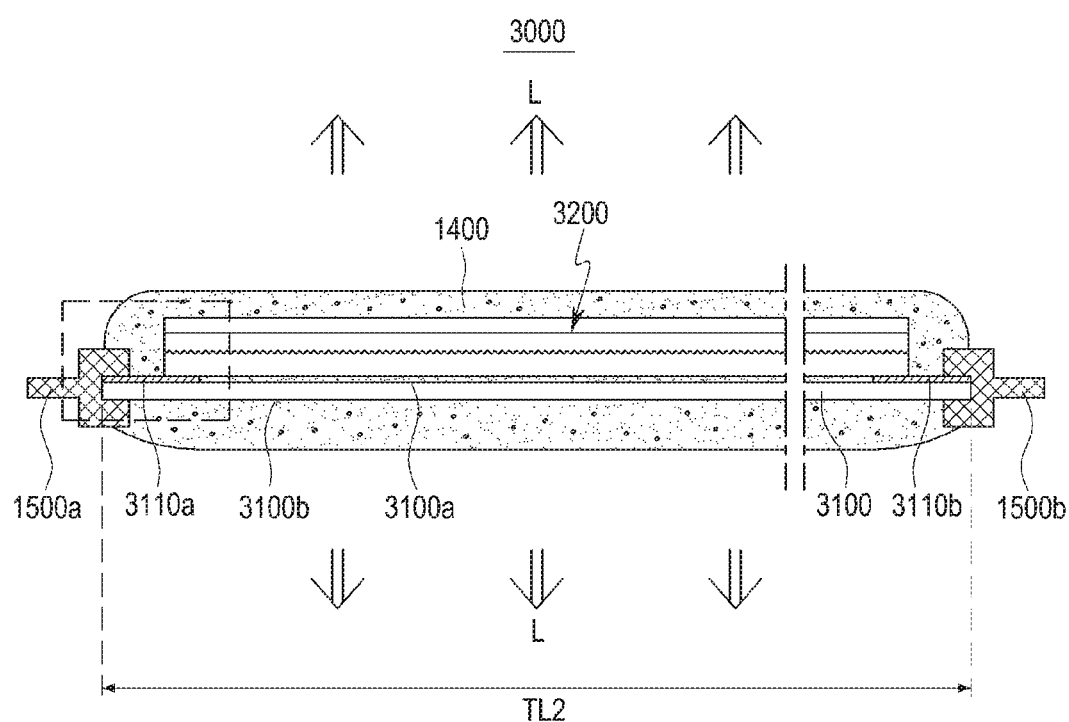
FIG. 17 is a side cross-sectional view of an LED module according to an exemplary embodiment of the present inventive concept.

FIG. 17 illustrates an LED module having a different structure from the embodiment described above for FIG. 11, for example.

Referring to FIG. 17, an LED module 3000 according to an exemplary embodiment of the inventive concept may include an LED chip 3200, a circuit board 3100 having one surface 3100a on which the LED chip 3200 is mounted and another surface 3100b opposing the surface 3100a. In addition, the LED module 3000 may include a wavelength conversion portion 1400 surrounding the LED chip 3200. A first bonding pad 3110a and a second bonding pad 3100b to which the LED chip 3200 is connected by solder may be disposed in the surface 3100a of the circuit board 3100.

When compared to the previous embodiment (refer to FIG. 11), there is a difference in that a plurality of LED chips are replaced with a single LED chip 3200 having a multijunction structure. The LED chip 3200 having a multijunction structure may include a plurality of light emitting cells sharing a first conductivity-type semiconductor by mesa-etching a portion of a single semiconductor stack. Thus, when a plurality of semiconductor light emitting devices are replaced with the LED chip 3200 having the multijunction structure, a length of an LED module may be shorter than a length of an LED module having the same number of light emitting cells. Therefore, manufacturing costs may be reduced. When compared to the embodiment of FIG. 11, a length TL2 of the LED module 3000 of FIG. 17 is shorter than a length TL1 of the LED module 1000 of FIG. 11. Therefore, costs of manufacturing the circuit board 3100 and the wavelength conversion portion 1400 may be reduced.

As set forth above, according to exemplary embodiments of the present inventive concept, an LED module array and an LED lamp using the LED module array may have reduced manufacturing costs and excellent light distribution.

While the present invention has been particularly shown and described with reference to exemplary embodiments thereof, it will be apparent to those skilled in the art that modifications and variations could be made thereto without departing from the scope of the present inventive concept, as defined by the appended claims.

What is claimed is:

1. A light emitting diode (LED) module array, comprising:
a plurality of LED groups connected to each other in series, each LED group including a single rod-shaped LED module or a plurality of LED modules connected to each other in parallel,
wherein a number of the plurality of LED modules included in a first LED group is different from a number of the plurality of LED modules included in a second LED group.

2. The LED module array of claim 1, further comprising a third LED group, wherein the second LED group is disposed between the first and third LED groups.

3. The LED module array of claim 1, wherein the first and third LED groups are disposed at ends of the second LED group.

4. The LED module array of claim 2, wherein the number of the plurality of LED modules included in the second LED group is less than the number of the plurality of LED modules included in each of the first and third LED groups.

5. The LED module array of claim 2, wherein a number of LED chips provided in an LED module included in the second LED group is less than a number of LED chips provided in an LED module included in each of the first and third LED groups.

6. The LED module array of claim 2, wherein a length of an LED module included in the second LEI) group is shorter than a length of an LED module included in each of the first and third LED groups.

7. The LED module array of claim 1, wherein at least one of the LED modules includes:
a transparent substrate, having a first surface and a second surface opposing the first surface;
a plurality of LED chips mounted on the first surface of the transparent substrate, and electrically connected to each other;
a first connection terminal and a second connection terminal disposed at ends of the transparent substrate and electrically connected to the plurality of LED chips; and
a wavelength conversion portion covering the LED chips.

8. The LED module array of claim 7, wherein a length of a transparent substrate of an LED module included in the first LED group is shorter than a length of a transparent substrate of an LED module included in the second LED group.

9. The LED module array of claim 1, further comprising a conductive frame to connect the first and second LED groups to each other.

10. A light emitting diode (LED) lamp, comprising:
a bulb;
a base disposed at a first end of the bulb; and
an LED module array disposed in an internal space of the bulb,
wherein the LED module array includes a plurality of LED groups connected to each other in series, each LED group including a single rod-shaped LED module or a plurality of LED modules connected to each other in parallel, and a number of the plurality of LED modules included in a first LED group is different from a number of the plurality of LED modules included in a second LED group.

11. The LED lamp of claim 10, wherein the second LED group is disposed on a central axis extended from the first end to a second end of the bulb.

12. The LED lamp of claim 11, wherein the second LED group is disposed at a first angle with respect to the central axis and the first LED group is disposed at a second angle with respect to the central axis.

13. The LED lamp of claim 12, wherein a length of an LED module of the first LED group is greater than a length of an LED module of the second LED group.

14. The LED lamp of claim 11, wherein each of the LED modules of the first LED group has the same angle with respect to the central axis.

15. The LED lamp of claim 14, wherein the LED modules of the second LED group are disposed in parallel, perpendicular to the central axis.

16. The LED lamp of claim 10, wherein at least one of the LED modules includes:
   a transparent substrate having a first surface and a second surface opposing the first surface;
   a plurality of LED chips mounted on the first surface of the transparent substrate, and electrically connected to each other;
   a first connection terminal and a second connection terminal disposed at ends of the transparent substrate and electrically connected to the plurality of LED chips; and a wavelength conversion portion covering the LED chips.

17. The LED lamp of claim 16, wherein the LED module array includes a first LED module array and a second LED module array, and
   a wavelength conversion portion included in each of the first LED module array and the second LED module array has a different type of wavelength conversion material.

18. The LED lamp of claim 17, further comprising:
   a power supply unit for supplying power to the first LED module array and the second LED module array, wherein the power supply unit selectively drives the first LED module array and the second LED module array.

* * * * *